United States Patent
Udagawa

(10) Patent No.: US 6,664,575 B2
(45) Date of Patent: Dec. 16, 2003

(54) GAINP STACKED LAYER STRUCTURE AND FIELD-EFFECT TRANSISTOR MANUFACTURED USING THE SAME

(75) Inventor: Takashi Udagawa, Saitama (JP)

(73) Assignee: Showa Denko Kabushiki Kaisha, Tokyo (JP)

(*) Notice: Subject to any disclaimer, the term of this patent is extended or adjusted under 35 U.S.C. 154(b) by 56 days.

(21) Appl. No.: 10/001,815

(22) Filed: Dec. 5, 2001

(65) Prior Publication Data
US 2002/0066911 A1 Jun. 6, 2002

Related U.S. Application Data
(60) Provisional application No. 60/262,041, filed on Jan. 18, 2001.

(30) Foreign Application Priority Data
Dec. 5, 2000 (JP) .................................. P2000-369705

(51) Int. Cl.[7] ............................................. H01L 31/072
(52) U.S. Cl. ..................... 257/201; 257/21; 257/86; 257/94; 257/192; 257/197; 257/201; 438/173
(58) Field of Search ..................... 257/21, 86, 94, 257/192, 197, 201; 438/173

(56) References Cited

U.S. PATENT DOCUMENTS 5,453,631 A * 9/1995 Onda et al. ................. 257/192
6,342,411 B1 * 1/2002 Pitts, Jr. ...................... 438/173

OTHER PUBLICATIONS

H.M. Shieh, et al, "Improved GaAs/In$_{0.25}$Ga$_{0.75}$As/GaAs Pseudomorphic Heterostructure by Growing Double δ–Doping GaAs Layers on Both Sides of the Channel", Solid–State Electronics, 1993, vol. 36, No. 9, pp. 1235–1237.

Boris Pereiaslavets, et al, "Narrow–Channel GaInP/InGaAs/GaAs MODFET's for High–Frequency and Power Applications", IEEE Transactions on Electron Devices, 1997, vol. 44, No. 9, pp. 1341–1348.

Shey–Shi Lu, et al, "The Effect of Gate Recess Profile on Device Performance of Ga$_{0.511n}$0.49P/In$_{0.2}$Ga$_{0.8}$As Doped–Channel FET's", IEEE Transactions on Electron Devices, 1999, vol. 46, No. 1, pp. 48–54.

Yi–Jen Chan, et al, "Ga$_{0.51}$In$_{0.49}$P/GaAs HEMT's Exhibiting Good Electrical Performance at Cryogenic Temperatures", IEEE Transactions on Electron Devices, 1990, vol. 37, No. 10, pp. 2141–2147.

* cited by examiner

Primary Examiner—David Nelms
Assistant Examiner—Mai-Huong Tran
(74) Attorney, Agent, or Firm—Sughrue Mion, PLLC

(57) ABSTRACT

A GaInP stacked layer structure 1 having a GaAs single crystal substrate 10 having stacked on the surface thereof at least a buffer layer 11, an electron channel layer 12 composed of Ga$_X$In$_{1-X}$As ($0 \leq X \leq 1$), a spacer layer 13 composed of GaInP and an electron supply layer 14 composed of GaInP is disclosed. The electron channel layer 12 contains a compositional gradient region imparted with a gradient by increasing the indium composition ratio (1-X) in the direction of the layer thickness increasing toward the junction interface 12b with the electron supply layer 14 side.

13 Claims, 3 Drawing Sheets

GAINP STACKED LAYER STRUCTURE AND FIELD-EFFECT TRANSISTOR MANUFACTURED USING THE SAME

CROSS REFERENCE TO RELATED APPLICATIONS

This application is an application filed under 35 U.S.C. §111(a) claiming benefit pursuant to 35 U.S.C. §119(e)(1) of the filing date of Provisional Application No. 60/262,041 filed Jan. 18, 2001 pursuant to 35 U.S.C. §111(b).

FIELD OF THE INVENTION

The present invention relates to a GaInP stacked layer structure comprising a GaAs single crystal substrate having stacked on the surface thereof at least a buffer layer, an electron channel layer composed of $Ga_XIn_{1-X}As$ ($0 \leq X \leq 1$), a spacer layer composed of $Ga_ZIn_{1-Z}P$ ($0 \leq Z \leq 1$), and an electron supply layer composed of $Ga_YIn_{1-Y}P$ ($0 \leq Y \leq 1$), and also relates to a field-effect transistor manufactured using the same.

BACKGROUND OF THE INVENTION

As one kind of field-effect transistors (FET) capable of operating in a millimeter wave region, a GaInP high electron mobility field-effect transistor (simply called TEFGET, MODFET or the like) using a gallium indium phosphide mixed crystal ($Ga_YIn_{1-Y}P$: $0 \leq Y \leq 1$) is known (see, IEEE Trans. Electron Devices, Vol. 37, No. 10 (1990), pp. 2141–2147). The GaInP MODFET is being used, for example, as a low-noise signal amplification device in the microwave region (see, IEEE Trans. Electron Devices, Vol. 46, No. 1 (1999), pp. 48–54) or a high-frequency transmission device (see, IEEE Trans. Electron Devices, Vol. 44, No. 9 (1997), pp. 1341–1348).

FIG. 4 is a schematic view showing a cross-sectional structure of conventional GaInP TEGFET. For the substrate 90, a semi-insulating gallium arsenide (chemical formula: GaAs) having a {001} crystal face as the main plane is used. On the surface of the substrate 90, a buffer layer 91 composed of a high-resistance III-V compound semiconductor layer is deposited. On the buffer layer 91, an electron channel layer 92 composed of an n-type gallium indium arsenide mixed crystal ($Ga_XIn_{1-X}As$: $0 \leq X \leq 1$) is deposited. On the electron channel layer 92, a spacer layer 93 is deposited. The spacer layer 93 is generally composed of undoped $Ga_ZIn_{1-Z}P$ ($0 \leq Z \leq 1$) (see, IEEE Trans. Electron Devices, Vol. 44 (1997), supra). On the spacer layer 93, an electron supply layer 94 composed of an n-type gallium indium phosphide mixed crystal ($Ga_YIn_{1-Y}P$: $0 \leq Y \leq 1$) is deposited. The carrier (electron) concentration of the electron supply layer 94 is adjusted by intentionally adding (doping) an n-type impurity with low diffusibility, such as silicon (Si). On the electron supply layer 94, a contact layer 95 composed of n-type GaAs or the like is generally provide for the formation of respective ohmic electrodes of low contact resistance source electrode 96 and drain electrode 97. In the recess structure part between the source and drain electrodes 96 and 97, a Schottky junction-type gate electrode 98 is provided on the exposed surface of the electron supply layer 94, thereby constructing TEGFET 910.

In the region near the junction interface 92b between the electron channel layer 92 and the spacer layer 93 (when a spacer layer 93 is not provided, the electron supply layer 94), electrons fed from the electron supply layer 94 are accumulated as two-dimensional electrons. In general, as the barrier at the junction interface 92b between the electron channel layer 92 and the spacer layer 93 (or electron supply layer 94) is higher, the two-dimensional electrons exerting high mobility can be more efficiently accumulated. As a usual practice, the electron channel layer 92 is composed of $Ga_XIn_{1-X}As$ having a constant composition in the thickness direction. The indium composition ratio is mainly about 0.25 (25%) at most (see, Solid-State Electron., 36 (9)(1993), pp. 1235–1237).

However, when the indium composition (=(1-X)) is set almost constant and moreover, to be about 0.25 at most, as in the above-described conventional electron channel layer 92, the attempt to increase the height of the barrier in the vicinity of the junction interface 92b with the spacer layer 93 is limited. Therefore, two-dimensional electrons cannot be efficiently accumulated in the region near the junction interface 92b. As a result, the mobility of two-dimensional electrons cannot be enhanced and this causes a problem that a low-noise GaInP TEGFET using the mobility cannot be obtained.

Under these circumstances, the present invention has been made and an object of the present invention is to provide a GaInP stacked layer structure capable of efficiently accumulating two-dimensional electrons, thereby enhancing mobility of two-dimensional electrons, and being used as a low-noise device using the high mobility. Another object of the present invention includes providing a field-effect transistor manufactured using the GaInP stacked layer structure.

SUMMARY OF THE INVENTION

In order to attain the above-described objects, in an embodiment of the present invention, a GaInP stacked layer structure comprises a GaAs single crystal substrate having stacked on the surface thereof at least a buffer layer, an electron channel layer composed of $Ga_XIn_{1-X}As$ ($0 \leq X \leq 1$), a spacer layer composed of $Ga_ZIn_{1-Z}P$ ($0 \leq Z \leq 1$), and an electron supply layer composed of $Ga_YIn_{1-Y}P$ ($0 \leq Y \leq 1$), the electron channel layer contains a compositional gradient region increased in the indium composition ratio (1-X) toward the electron supply layer side.

In a second embodiment of the present invention, in addition to the construction of the above embodiment of the present invention, the compositional gradient region is continuously or discontinuously changed in the indium composition ratio (1-X).

In a third embodiment of the present invention, in addition to the construction of the above embodiments of the present invention, the indium composition ratio (1-X) is from 0.30 to 0.50 at the junction interface in the electron supply layer side.

In a fourth embodiment of the present invention, in addition to the construction of the above embodiments of the present invention, the electron channel layer has a layer thickness of 1 to 5 nanometer.

In a fifth embodiment of the present invention, in addition to the construction of the above embodiments of the present invention, the electron channel layer is composed of n-type $Ga_XIn_{1-X}As$ ($0 \leq X \leq 1$) having added thereto boron (symbol of element: B).

In a sixth embodiment of the present invention of claim, in addition to the construction of the above embodiments of the present invention, the spacer layer is composed of $Ga_ZIn_{1-Z}P$ ($0 \leq Z \leq 1$) and contains a compositional gradient region reduced in the gallium composition ratio toward the electron supply layer side.

In a seven embodiment of the present invention, in addition to the construction of the above embodiments of the present invention, the spacer layer is not provided.

An eighth embodiment of the present invention relates to a field-effect transistor manufactured using the GaInP staked layer structure of any one of the above embodiments.

DETAILED DESCRIPTION OF THE INVENTION

Figure 1D:
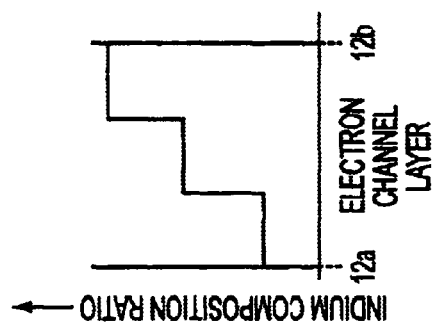
FIG. 1 is a view for explaining the GaInP stacked layer structure of the present invention.
FIG. 1(a) is a view schematically showing a cross section of the GaInP stacked layer structure.
FIGS. 1(b), (c) and (d) each is a view showing the compositional gradient of indium in the electron channel layer.

An embodiment of the present invention is described in detail below by referring to the drawings.

FIG. 1 is an explanatory view of a GaInP stacked layer structure according to the present invention. FIG. 1(a) is a view schematically showing a cross section of the GaInP stacked layer structure and each of FIGS. 1(b), (c) and (d) shows the manner of the compositional gradient of indium in the electron channel layer. In this Figure, the GaInP stacked layer structure 1 according to the present invention has a buffer layer 11, an electron channel layer 12 composed of $Ga_XIn_{1-X}As$ ($0 \leq X \leq 1$), a spacer layer 13 composed of $Ga_ZIn_{1-Z}P$ ($0 \leq Z \leq 1$) and an electron supply layer 14 composed of $Ga_YIn_{1-Y}P$ ($0 \leq Y \leq 1$), which are stacked and formed on a GaAs single crystal substrate 10. In this GaInP stacked layer structure 1, a compositional gradient is imparted to the electron channel layer 12 by increasing the indium composition ratio (1-X) in the direction of the junction interface 12b with the spacer layer 13.

Figure 1C:
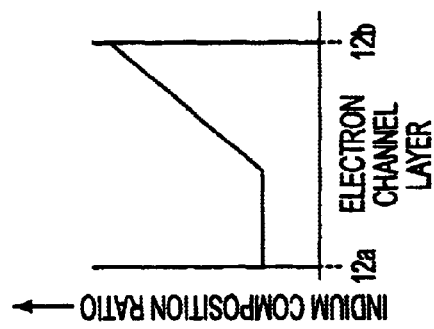
Figure 1B:
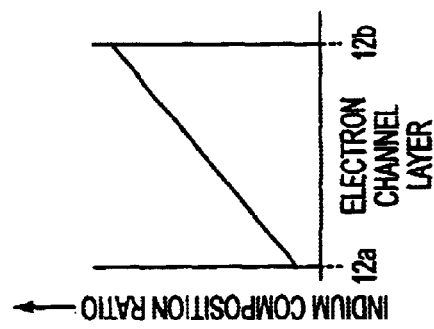
Figure 1A:
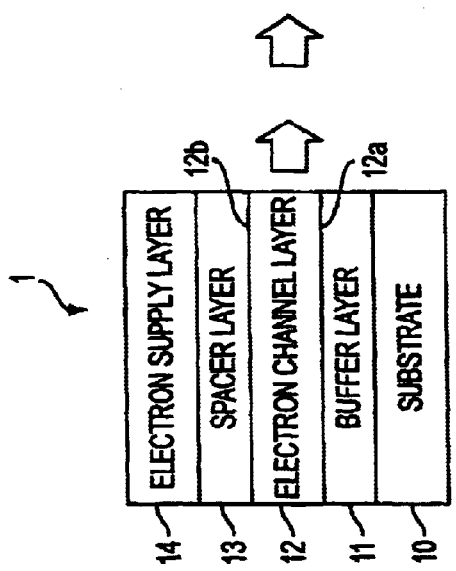

For example, in FIG. 1(b), the indium composition ratio (=(1-X)) is linearly increased from the junction interface 12a with the buffer layer 11 in the direction toward the junction interface 12b with the spacer layer 13 as the layer thickness increases. In FIG. 1(c), the indium composition ratio is kept constant until a predetermined layer thickness from the junction interface 12a and thereafter linearly increased in the direction of the junction interface 12b as the layer thickness increases. In FIG. 1(d), the indium composition ratio is discontinuously increased in the direction of the junction interface 12a toward the junction interface 12b. For example, the composition ratio is discontinuously increased such that the indium composition ratio is about 0.18 in a first region extending to a layer thickness of 7 nm from the junction interface 12a with the buffer layer 11, about 0.25 in a second region next to the first region having a layer thickness of 2 nm and 0.30 in a third region extending from the second region to the junction interface 12b with the spacer layer 13.

In the embodiment of the present invention, the indium composition ratio is from 0.30 to 0.50 in the electron channel layer 12 at the junction interface 12b with the spacer layer 13.

Here, when the spacer layer 13 is composed of $Ga_{0.51}In_{0.49}P$ having a Ga composition ratio of 0.51, the calculated forbidden band gap of the spacer layer 13 is about 1.88 eV (see, Isamu Akasaki (compiler), III-V Zoku Kagobutsu Handotai (III-V Compound Semiconductor), Baifukan, page 187, first edition issued on May 20, 1994). On the other hand, when the electron channel layer 12 is composed of $Ga_{0.70}In_{0.30}As$ having an indium composition ratio of 0.30 at the junction interface 12b, the forbidden band gap is about 1.01 electron volt (eV) at room temperature (see, III-V Compound Semiconductor, supra). Accordingly, the difference in the forbidden band gap between the electron channel layer 12 and the spacer layer 13 is about 0.87 eV. Furthermore, when the indium composition ratio of the electron channel layer 12 is 0.30 or more at the junction interface 12b, the difference in the forbidden band gap between the electron channel layer 12 and the spacer layer 13 can be widened more than when using conventional techniques and this is advantageous in that two-dimensional electrons can be efficiently accumulated in the junction interface 12b side of the electron channel layer 12.

However, if the indium composition ratio is extremely increased, the non-uniformity of indium composition becomes excessive and the flatness on the surface of the electron channel layer 12 is impaired. As a result, the junction interface 12b with the spacer layer 13 cannot form a flat face and high mobility cannot be stably attained. Therefore, the indium composition ratio of the electron channel layer 12 is preferably 0.5 or less at the junction interface 12b with the spacer layer 13.

The forbidden band gap of $Ga_ZIn_{1-Z}P$ constituting the spacer layer 13 or $Ga_YIn_{1-Y}P$ constituting the electron supply layer 14 becomes large when the gallium composition ratio is increased (see, III-V Compound Semiconductor, supra, page 187), whereas the forbidden band gap of $Ga_XIn_{1-X}As$ constituting the electron channel layer 12 becomes small when the indium composition ratio is increased. Accordingly, by adjusting the composition ratios such that the gallium composition ratio of the spacer layer 13 becomes larger toward the junction interface 12b and the indium composition ratio of the electron channel layer 12 becomes smaller toward the junction interface 12b, the difference in the forbidden band gap between the electron channel layer 12 and the spacer layer 13 can be made larger, thereby increasing the barrier between these two layers. That is, a heterojunction structure advantageous to efficiently localizing and accumulating two-dimensional electrons inside the electron channel layer 12, thereby exerting high electron mobility can be obtained.

In the embodiment of the present invention, the layer thickness in the compositional gradient region provided inside the electron channel layer 12 is from 1 to 5 nanometer (nm). If the thickness of the compositional gradient region is less than 1 nm, two-dimensional electrons cannot be satisfactorily localized and accumulated. If the layer thickness of the compositional gradient region having an increased indium composition exceeds 5 nm, the lattice mismatch with $Ga_ZIn_{1-Z}P$ constituting the upper spacer layer 13 increases, thereby inhibiting the preferable formation of a good-quality spacer layer 13. As the indium composition ratio (=(1-X)) of $Ga_XIn_{1-X}As$ constituting the compositional gradient region is larger, better results can be obtained by reducing the layer thickness of the compositional gradient region. The compositional gradient region is preferably constituted by a high-purity n-type $Ga_XIn_{1-X}As$ layer having a low carrier concentration. The carrier concentration is preferably $5 \times 10^{16}$ cm$^{-3}$ or less, more preferably $1 \times 10^{16}$ cm$^{-3}$ or less. The carrier concentration can be measured using a conventional method such as Hall effect measurement or capacitance-voltage (C-V) measurement.

Furthermore, in the embodiment of the present invention, the electron channel layer 12 is constructed as a layer composed of an n-type $Ga_xIn_{1-x}As$ having added thereto boron (symbol of element: B). By doping with boron, the carrier concentration of the electron channel layer 12 can be reduced. In particular, as the indium composition ratio is larger, the carrier concentration can be effectively reduced by increasing the amount of boron doped. For example, the carrier concentration of the electron channel layer 12 composed of $Ga_xIn_{1-x}As$, which is $4\times10^{16}$ cm$^{-3}$ in the undoped state, can be reduced by about one figure after doping with boron. Therefore, the two-dimensional electrons accumulated inside the electron channel layer 12 can be less affected by scattering. As a result, a high mobility can be exhibited and a GaInP-type high electron mobility transistor having excellent transconductance ($g_m$) characteristics can be provided.

The boron-doped electron channel layer 12 containing a compositional gradient region can be formed by doping with boron during the film formation of the $Ga_xIn_{1-x}As$ layer. Examples of the boron doping source include trimethyl boron (($CH_3$)$_3$B) and triethyl boron (($C_2H_5$)$_3$B). The boron is preferably doped to give an atomic concentration of boron of $1\times10^6$ to $1\times10^8$ atoms/cm$^3$. Furthermore, boron doping is preferably performed such that the atomic concentration approximately surpasses the carrier concentration of the $Ga_xIn_{1-x}As$ layer. The atomic concentration of boron inside the $Ga_xIn_{1-x}As$ layer can be adjusted by the amount of the boron doping source fed to the growth reaction system. Also, the atomic concentration of boron inside the $Ga_xIn_{1-x}As$ layer can be measured, for example, by the general secondary ion mass spectroscopy (SIMS).

As described in the foregoing, according to the embodiment of the present invention, the electron channel layer 12 contains a compositional gradient region where the indium compositional ratio increases in the direction of the layer thickness as it becomes larger toward the junction interface 12b with the spacer layer 13 side, so that the difference in the forbidden band gap between the electron channel layer 12 and the spacer layer 13 can be larger and a higher barrier can be formed between those two layers. By virtue of this higher barrier, the electrons fed from the electron supply layer 14 can be efficiently accumulated as two-dimensional electrons inside the electron channel layer 12 and a high electron mobility can be realized. Accordingly, a field-effect transistor having excellent transconductance ($g_m$) characteristics can be provided.

Furthermore, the indium composition ratio at the junction interface 12b of the electron channel layer 12 with the spacer layer 13 is from 0.30 to 0.50, so that two-dimensional electrons can be efficiently accumulated inside the electron channel layer 12 and at the same time, the spacer layer 13 or electron supply layer 14 can be prevented from the deterioration of crystallinity which occurs when the indium composition ratio is excessively high and the flatness on the surface of the electron channel layer 12 is impaired. Accordingly, the construction of the electron channel layer 12 can be made optimal for ensuring high electron mobility.

Also, the layer thickness of the compositional gradient region provided inside the electron channel layer 12 is from 1 to 5 nm, so that the electron channel layer 12 can be ensured with a layer thickness sufficiently large to attain satisfactory localization and accumulation of two-dimensional electrons inside the layer and at the same time, the lattice mismatch with the upper layer, which occurs when the layer thickness is excessively large, can be prevented. As a result, a spacer layer 13 or an electron supply layer 14 having excellent crystallinity can be formed without fail.

In addition, boron is doped into the electron channel layer 12, so that the carrier concentration of the electron channel layer 12 can be reduced and the two-dimensional electrons accumulated inside the electron channel layer 12 can be less affected by scattering. Also from this view point, a high electron mobility can be realized and a field-effect transistor having excellent transconductance ($g_m$) characteristics can be provided.

The electron channel layer 12 has a gradient where the indium composition ratio increases in the direction of the layer thickness as it becomes larger toward the junction interface 12b with the spacer layer 13 side. At the same time, the spacer layer 13 is composed of a $Ga_zIn_{1-z}P$ ($0 \leq Z \leq 1$) layer containing a compositional gradient region reduced in gallium composition ratio in the direction from the junction interface 12b with the electron channel layer 12 toward the electron supply layer 14 side as the layer thickness increases, to surely establish a high barrier between the two layers 12 and 13. Therefore, dimensional electrons can be efficiently accumulated inside the electron channel layer 12 and a high electron mobility can be exhibited.

The GaInP stacked layer structure of the present invention and a field-effect transistor manufactured using the structure are described in greater detail below by referring to Examples, which are not intended to limit the scope of the present invention.

EXAMPLES

Example 1

Figure 2:
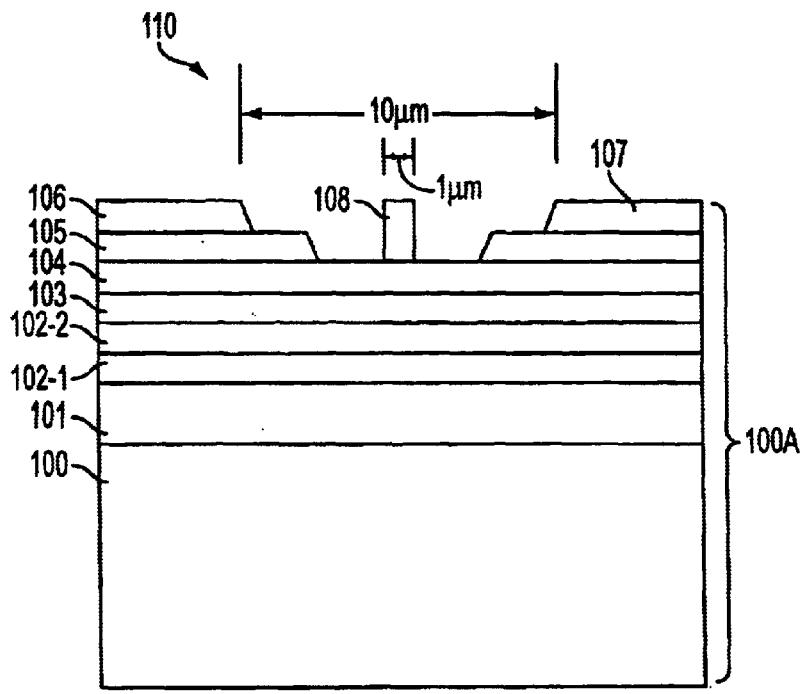
FIG. 2 is a schematic view showing a cross section of TEGFET of Example 1.

FIG. 2 is a schematic view showing a cross section of TEGFET manufactured in Example 1. In this Example, the present invention is described in detail by referring, as an example, to a GaInP high electron mobility field-effect transistor (TEGFET) comprising an electron channel layer having a compositional gradient region.

The epitaxial stacked layer structure 1A for use in TEGFET was constructed using an undoped semi-insulating (100) 2° of GaAs single crystal as a substrate 100. The GaAs single crystal of the substrate 100 had a resistivity of about $3\times10^7$ Ω·cm at room temperature.

On the surface of the substrate 100 having a diameter of about 100 mm, an $Al_CGa_{1-C}As/GaAs$ super-lattice structure for constituting a buffer layer 101 was deposited. The super-lattice structure was constructed by an undoped $Al_{0.30}Ga_{0.70}As$ layer having an aluminum composition ratio (=C) of 0.30 and an undoped p-type GaAs layer. The $Al_{0.30}Ga_{0.70}As$ layer had a carrier concentration of about $1\times10^{14}$ cm$^{-3}$ and a layer thickness of 45 nm. The p-type GaAs layer had a carrier concentration of $7\times10^{13}$ cm$^{-3}$ and a layer thickness of 50 nm. The number of stacked layer cycles of the $Al_{0.30}Ga_{0.70}As$ layer and p-type GaAs layer was 5. These $Al_{0.30}Ga_{0.70}As$ layer and p-type GaAs layer each was formed at 640° C. by the MOCVD method under reduced pressure using a reaction system of trimethyl gallium (($CH_3$)$_3$Ga)/trimethyl aluminum (($CH_3$)$_3$Al)/arsine ($AsH_3$)/hydrogen ($H_2$). The pressure during film formation was about $1.3\times10^4$ Pascal (Pa). For the carrier (transport) gas, hydrogen was used.

On the buffer layer 101, an undoped n-type $Ga_{0.80}In_{0.20}As$ layer was stacked by the MOCVD method under reduced pressure using a reaction system of ($CH_3$)$_3$Ga/cyclopentadienyl indium ($C_5H_5In$)/$AsH_3$/$H_2$, as a first constituent layer 102-1 constituting the electron channel layer (channel layer) 102. The layer thickness of the first layer 102-1 was about 9 nm. On the first layer 102-1, an n-type $Ga_{0.70}In_{0.30}As$ layer having an indium composition ratio of 0.30 was stacked as a second constituent layer 102-2. The layer thickness of the second layer 102-2 was about 2 nm. From these first and second constituent layers 102-1 and 102-2, the electron channel layer 102 having a gradient in the indium composition was constructed. In each of the first and second constituent layers 102-1 and 102-2 constituting the electron channel layer 102, the carrier concentration was $3\times10^{15}$ cm$^{-3}$.

On the GaInAs compositional gradient layer 102, a spacer layer 103 composed of an undoped n-type $Ga_{0.51}In_{0.49}P$ was stacked by the MOCVD method under reduced pressure using a reaction system of $(CH_3)_3Ga/C_5H_5In/PH_3/H_2$.

On the spacer layer 103, an electron supply layer 104 composed of an Si-doped n-type $Ga_{0.51}In_{0.49}P$ was stacked by the MOCVD method under reduced pressure using a reaction system of $(CH_3)_3Ga/C_5H_5In/PH_3/H_2$. The Si doping source used was a hydrogen-disilane ($Si_2H_6$) (concentration: 10 ppm by volume) mixed gas. The pressure during film formation was about $1.3\times10^4$ Pascal (Pa). The carrier concentration of the electron supply layer 104 was $2\times10^{18}$ cm$^{-3}$ and the layer thickness thereof was 25 nm.

On the surface of the electron supply layer 104, a contact layer 105 composed of an Si-doped n-type GaAs was stacked using a reaction system of $(CH_3)_3Ga/AsH_3/H_2$. The Si doping source used was the above-described hydrogen-disilane mixed gas. The carrier concentration of the contact layer 105 was $2\times10^{18}$ cm$^{-3}$ and the layer thickness thereof was about 50 nm. Here, since the gallium composition ratio of the electron supply layer 104 composed of $Ga_yIn_{1-y}P$ was adjusted to 0.51, thereby having an almost equal lattice constant with the contact layer 105 composed of GaAs stacked thereon, these two layers exhibited good lattice matching.

After thus completing the epitaxial growth of the constituent layers 101 to 105 constituting the stacked layer structure 100A, the temperature was lowered to about 500° C. in an atmosphere containing arsine ($AsH_3$) and then the system was cooled to room temperature in a hydrogen atmosphere.

On the surface of the outermost n-type GaAs contact layer 105, an ohmic electrode composed of indium.tin (In.Sn) alloy was formed. Thereafter, the electron mobility attributable to two-dimensional electrons channel the electron channel layer 102 was measured by the ordinary Hall effect measurement. At room temperature (about 300 kelvin (K)), the sheet carrier concentration ($n_s$) was about $1.8\times10^{12}$ cm$^{-2}$ and the electron mobility ($\mu_{RT}$) was about 5,700 cm$^2$/V·s. Incidentally, in the conventional case where the electron channel layer is constructed by a $Ga_{0.80}In_{0.20}As$ layer not containing a compositional gradient region and having a constant indium composition ratio of 0.20, the electron mobility ($\mu_{RT}$) is about 3,500 cm$^2$/V·s. Compared with this, remarkable improvement was attained in this Example.

The surface of the outermost n-type GaAs contact layer 105 was processed into a recess state by a patterning method using a known photolithography technique. On the remaining n-type GaAs contact layer 105 in the mesa form, a source electrode 106 and a drain electrode 107 were formed. The source and drain ohmic electrodes 106 and 107 each was composed of a gold.germanium (Au: 93 wt %, Ge: 7 wt %).nickel (Ni).gold (Au) multilayer structure. The distance between the source electrode 106 and the drain electrode 107 was 10 μm. On the surface of the $Ga_{0.51}In_{0.49}P$ electron supply layer 104 exposed to the recess part, a multilayer structure Schottky junction-type gate electrode 108 consisting of a lower titanium (Ti) layer and an upper aluminum (Al) layer was formed. The gate length of the gate electrode 108 was about 1 μm.

The direct current (DC) characteristics of the thus-constructed GaInP TEGFET 110 were evaluated. With a drain voltage of 2 volt (V), the saturated drain current ($I_{dss}$) was about 68 milliampere (mA). At the time when the drain voltage was swept between 0 V and 5 V, almost no loop (hysteresis) was observed on the drain current. The transconductance ($g_m$) measured at room temperature with a source-to-drain voltage of 2.0 V was as high as 200±5 millisiemens (mS)/mm and was homogeneous. Incidentally, in the conventional case where the electron channel layer is constructed by a $Ga_{0.80}In_{0.20}As$ layer not containing a compositional gradient region and having a constant indium composition ratio of 0.20, the transconductance ($g_m$) is about 150 millisiemens (mS)/mm. Compared with this, remarkable improvement was attained in this Example.

The leakage current passing through Au.Ge ohmic electrodes at a distance of 100 μm, which were formed on the exposed surface of the buffer layer 101, was less than 1 μA at 40 V, revealing low leakage property. Accordingly, the gate pinch-off voltage was about −0.9 V±0.03 V and a GaInP TEGFET having a homogeneous threshold voltage was provided.

Example 2

Figure 3:
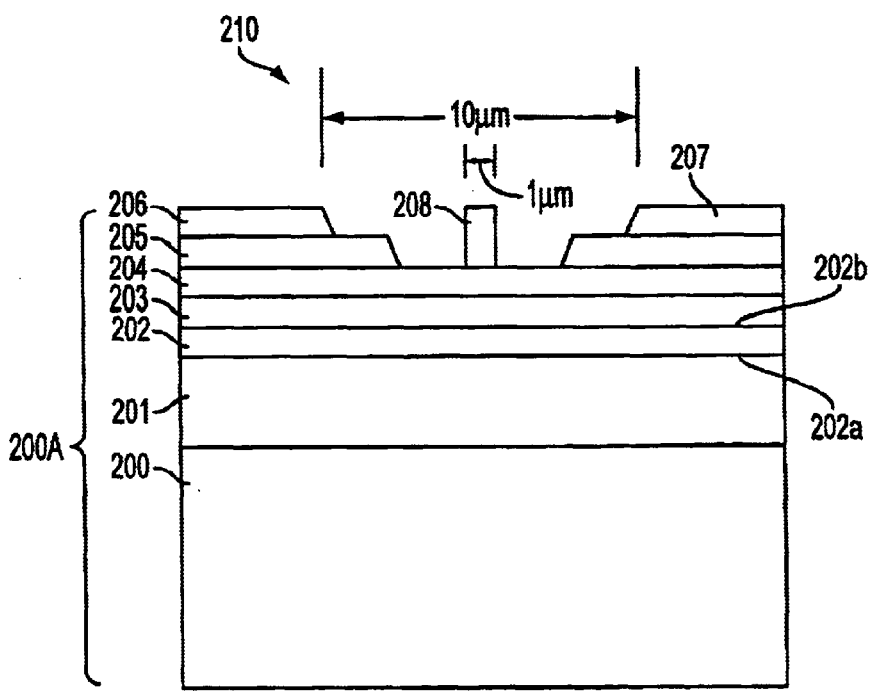
FIG. 3 is a schematic view showing a cross section of TEGFET of Example 2.
Figure 4:
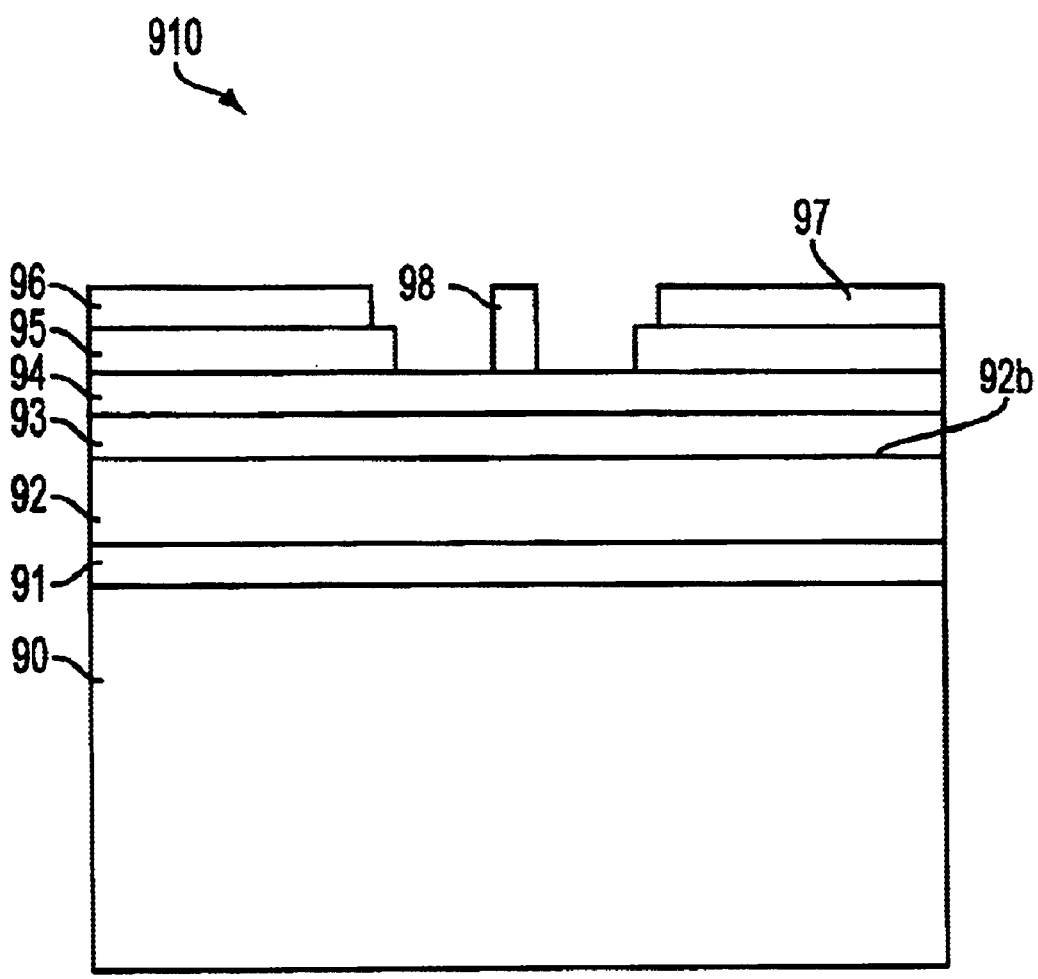
FIG. 4 is a schematic view showing a cross-sectional structure of a conventional GaInP TEGFET.

FIG. 3 is a schematic view showing a cross section of TEGFET of Example 2. The same constituent elements as in Example 1 are allotted with the numbers of Example 1 except using the numeral 1 in the first figure as 2. The stacked layer structure 200A has a substrate 200, a buffer layer 201, an electron channel layer 202, a spacer layer 203, an electron supply layer 204, and a contact layer 205. On the contact layer 205 in the mesa form, there are a source electrode 206 and a drain electrode 207. On the surface of the electron supply layer 204 exposed to the recess part, there is a multilayer structure Schottky junction-type gate electrode 208.

In this Example, the electron channel layer 202 was constructed to have a $Ga_xIn_{1-x}As$ compositional gradient region such that the indium composition ratio was 0.20 at the junction interface 202a with the buffer layer 201 and about 0.35 at the junction interface 202b with the spacer layer 203. The layer thickness of the electron channel layer 202 was about 8 nm. For imparting a gradient to the indium composition ratio, the ratio ($=(CH_3)_3In/(CH_3)_3Ga$) of the indium source (trimethyl indium: $(CH_3)_3In$) to the gallium source fed to the MOCVD reaction system was uniformly and linearly increased in aging along with increase in the layer thickness. The carrier concentration of the electron channel layer 202 was set to about $4\times10^{16}$ cm$^{-3}$.

The stacked layer structure 200A was measured on the sheet carrier concentration ($n_s$) at room temperature (about 300 K) by the general Hall effect measurement and found to be about $1.7\times10^{12}$ cm$^{-2}$. The average electron mobility ($\mu_{RT}$) was about 6,000 cm$^2$/V·s. Thus, a high electron mobility was exhibited. Furthermore, a GaInP TEGFET 210 was fabricated in the same manner as in Example 1 and the transconductance ($g_m$) thereof at room temperature with a drain voltage of 2.0 V was as high as 210±5 millisiemens (mS)/mm. Thus, a high-performance TEGFET was provided.

Example 3

In this Example, the present invention is specifically described by referring to a GaInP TEGFET comprising a $Ga_xIn_{1-x}As$ electron channel layer having the same indium composition gradient as in Example 2 and being doped with boron (B). The TEGFET of this Example differs from that of Example 2 only in the $Ga_xIn_{1-x}As$ electron channel layer and therefore, is described using FIG. 3.

In Example 3, boron was doped at the time of growing the $Ga_xIn_{1-x}As$ compositional gradient region constituting the electron channel layer 202. The boron doping source used was commercially available triethylboron ($(C_2H_5)_3B$) for electronic industry. By taking into account the fact that the carrier concentration of an undoped n-type $Ga_xIn_{1-x}As$ compositional gradient layer is about $4 \times 10^{16}$ cm$^{-3}$, the amount of the triethylboron fed to the MOCVD reaction system was set to give a boron atomic concentration of about $4 \times 10^{17}$ cm$^{-3}$ within the layer. By doping of boron, the carrier concentration of the Ga$_x$In$_{1-x}$As electron channel layer 202 became about $5 \times 10^{15}$ cm$^{-3}$ or less.

The sheet carrier concentration ($n_S$) measured at room temperature (about 300 K) by the general Hall effect measuring method was about $1.6 \times 10^{12}$ cm$^{-2}$ and the average electron mobility ($\mu_{RT}$) was about 6,400 cm$^2$/V·s. As such, by doping with boron to the electron channel layer 202, a higher electron mobility was exhibited as compared with the case of Example 2. The saturated source.drain current was about 70 mA with a drain voltage of 2 V and almost no hysteresis (loop) was observed on the drain current. The transconductance ($g_m$) at room temperature with a source-to-drain voltage of 2.0 V was as high as about 250 millisiemens (mS)/mm.

The present invention as having the above-described structures provides the following effects.

In the first and second embodiments, a compositional gradient region where the indium composition ratio increases in the direction toward the junction interface with the electron supply layer side as the layer thickness increases is provided in the electron channel layer, so that the difference in the forbidden band gap can be made larger at the junction interface of the electron channel layer in the electron supply layer side and the barrier between these two layers sandwiching the junction interface can be made higher. As a result, electrons supply from the electron supply layer can be efficiently accumulated as two-dimensional electrons inside the electron channel layer and a high electron mobility can be realized. Accordingly, a field-effect transistor having excellent transconductance characteristics can be provided.

In the third embodiment of the present invention, the indium composition ratio is set from 0.30 to 0.50 at the junction interface of the electron channel layer in the electron supply layer side, so that two-dimensional electrons can be efficiently accumulated inside the electron channel layer and at the same time, the spacer layer or the electron supply layer can be unfailingly prevented from deterioration of the crystallinity, which is generated when the indium composition ratio is excessively high and the flatness on the surface of the electron channel layer is impaired.

In the fourth embodiment of the present invention, the layer thickness of the electron channel layer is from 1 to 5 nm, so that the electron channel layer can be ensured with a layer thickness sufficiently large to attain satisfactory localization and accumulation of two-dimensional electrons within the layer and at the same time, to prevent the lattice mismatch with the upper layer and thereby, a spacer layer or an electron supply layer having excellent crystallinity can be formed without fail.

In the fifth embodiment of the present invention, boron is doped into the electron channel layer, so that the carrier concentration of the electron channel layer can be reduced and the two-dimensional electrons accumulated inside the electron channel layer can be less affected by the scattering. Also, a high electron mobility can be realized and a field-effect transistor favored with excellent transconductance characteristics can be provided.

In the sixth embodiment of the present invention, the spacer layer is composed of Ga$_X$In$_{1-X}$P ($0 \leq X \leq 1$) containing a compositional gradient region imparted with a gradient by reducing the gallium composition ratio in the direction of the layer thickness increasing toward the junction interface with the electron supply layer side, so that the barrier between the electron channel layer and the spacer layer can be unfailingly made high and therefore, two-dimensional electrons can be efficiently accumulated inside the electron channel layer. As a result, a high electron mobility can be exhibited.

While the invention has been described in detail and with reference to specific embodiments thereof, it will be apparent to one skilled in the art that various changes and modifications can be made therein without departing from the spirit and scope thereof.

What is claimed is:

1. A GaInP stacked layer structure comprising a GaAs single crystal substrate having stacked on the surface thereof at least a buffer layer, an electron channel layer composed of Ga$_x$In$_{1-x}$As ($0 \leq x \leq 1$), a spacer layer composed of Ga$_z$In$_{1-z}$P ($0 \leq z \leq 1$), and an electron supply layer composed of Ga$_y$In$_{1-y}$P ($0 \leq y \leq 1$), wherein said electron channel layer has a compositional gradient region where the indium composition ratio (1-X) increases toward the electron supply layer side and said electron channel layer is composed of n-type Ga$_x$In$_{1-x}$As ($0 \leq x \leq 1$) having added thereto boron.

2. The GaInP stacked layer structure as claimed in claim 1, wherein said compositional gradient region has a continuously or discontinuously varied indium composition ratio (1-X).

3. The GaInP stacked layer structure as claimed in claim 2, wherein said indium composition ratio (1-X) is from 0.30 to 0.50 at a junction interface with the electron supply layer.

4. The GaInP stacked layer structure as claimed in claim 2, wherein said electron channel layer has a layer thickness of 1 to 5 nanometer.

5. The GaInP stacked layer structure as claimed in claim 2, wherein said spacer layer is composed of Ga$_Z$In$_{1-Z}$P ($0 \leq Z \leq 1$) and has a compositional gradient region where the gallium composition ratio decreases toward the electron supply layer side.

6. A field-effect transistor comprising the GaInP staked layer structure claimed in claim 2.

7. The GaInP stacked layer structure as claimed in claim 1, wherein said indium composition ratio (1-X) is from 0.30 to 0.50 at a junction interface with the electron supply layer.

8. The GaInP stacked layer structure as claimed in claim 1, wherein said electron channel layer has a layer thickness of 1 to 5 nanometer.

9. The GaInP stacked layer structure as claimed in claim 1, wherein said spacer layer is composed of Ga$_Z$In$_{1-Z}$P ($0 \leq Z \leq 1$) and has a compositional gradient region where the gallium composition ratio decreases toward the electron supply layer side.

10. A field-effect transistor comprising the GaInP staked layer structure claimed in claim 1.

11. A GaInP stacked layer structure comprising a GaAs single crystal substrate having stacked on the surface thereof at least a buffer layer, an electron channel layer composed of Ga$_x$In$_{1-x}$As ($0 \leq x \leq 1$), and an electron supply layer composed of Ga$_y$In$_{1-y}$P ($0 \leq y \leq 1$), wherein said electron channel layer has a compositional gradient region where the indium composition ration (1-X) increases toward the electron supply layer side and said electron channel layer is composed of n-type Ga$_x$In$_{1-x}$As ($0 \leq x \leq 1$) having added thereto boron.

12. The GaInP stacked layer structure as claimed in claim 11, wherein the electron channel layer directly contacts the electron supply layer.

13. A field-effect transistor comprising the GaInP staked layer structure claimed in claim 11.

* * * * *